United States Patent [19]

Obata et al.

[11] Patent Number: 4,857,775
[45] Date of Patent: Aug. 15, 1989

[54] LOGIC INTEGRATED CIRCUIT DEVICE SELECTING AS OUTPUTS ANY TWO OF TWO INPUTS AND TWO LOGICAL COMBINATIONS OF THE INPUTS

[75] Inventors: Takeo Obata, Osaka; Akira Takata, Amagasaki; Takuro Fujioka, Minoo, all of Japan

[73] Assignee: Ricoh Company, Ltd., Tokyo, Japan

[21] Appl. No.: 181,737

[22] Filed: Apr. 14, 1988

[30] Foreign Application Priority Data

Apr. 17, 1987 [JP] Japan .................................. 62-95751

[51] Int. Cl.⁴ .......................................... H03K 19/094
[52] U.S. Cl. ..................................... 307/468; 307/450; 307/465; 307/471; 307/585
[58] Field of Search ............... 307/445, 448, 450, 451, 307/465, 468, 469, 471, 579, 584, 585; 364/716

[56] References Cited

U.S. PATENT DOCUMENTS

| | | | |
|---|---|---|---|
| 3,691,401 | 9/1972 | Forlani et al. | 307/468 X |
| 4,233,524 | 11/1980 | Burdick | 307/468 |
| 4,292,548 | 9/1981 | Suarez et al. | 307/465 |
| 4,495,427 | 1/1985 | Cartwright, Jr. | 307/451 X |
| 4,609,830 | 9/1986 | Brandman | 307/451 X |
| 4,609,838 | 9/1986 | Huang | 307/471 X |

*Primary Examiner*—David Hudspeth
*Attorney, Agent, or Firm*—Cooper & Dunham

[57] ABSTRACT

A logic integrated circuit device includes a pair of input terminals, an OR gate having a pair of inputs coupled to the pair of input terminals, an exclusive OR gate having a pair of inputs coupled to the pair of input terminals, a first output terminal connected from one of the pair of input terminals through a first gate switch and also from the output of the OR gate through a second gate switch, and a second output terminal connected from the other of the pair of input terminals through a third gate switch and also from the output of the exclusive OR gate through a fourth gate switch. Also provided is a data read out circuit which is operatively coupled to the four gate switches through a switch control circuit. Depending on the condition of the data read out circuit, either one of one of the pair of input signals and a logical sum signal between the pair of input signals is output at the first output terminal and either one of the other of the pair of input signals and an exclusive logical sum signal between the pair of input signals is output at the second output terminal.

6 Claims, 3 Drawing Sheets

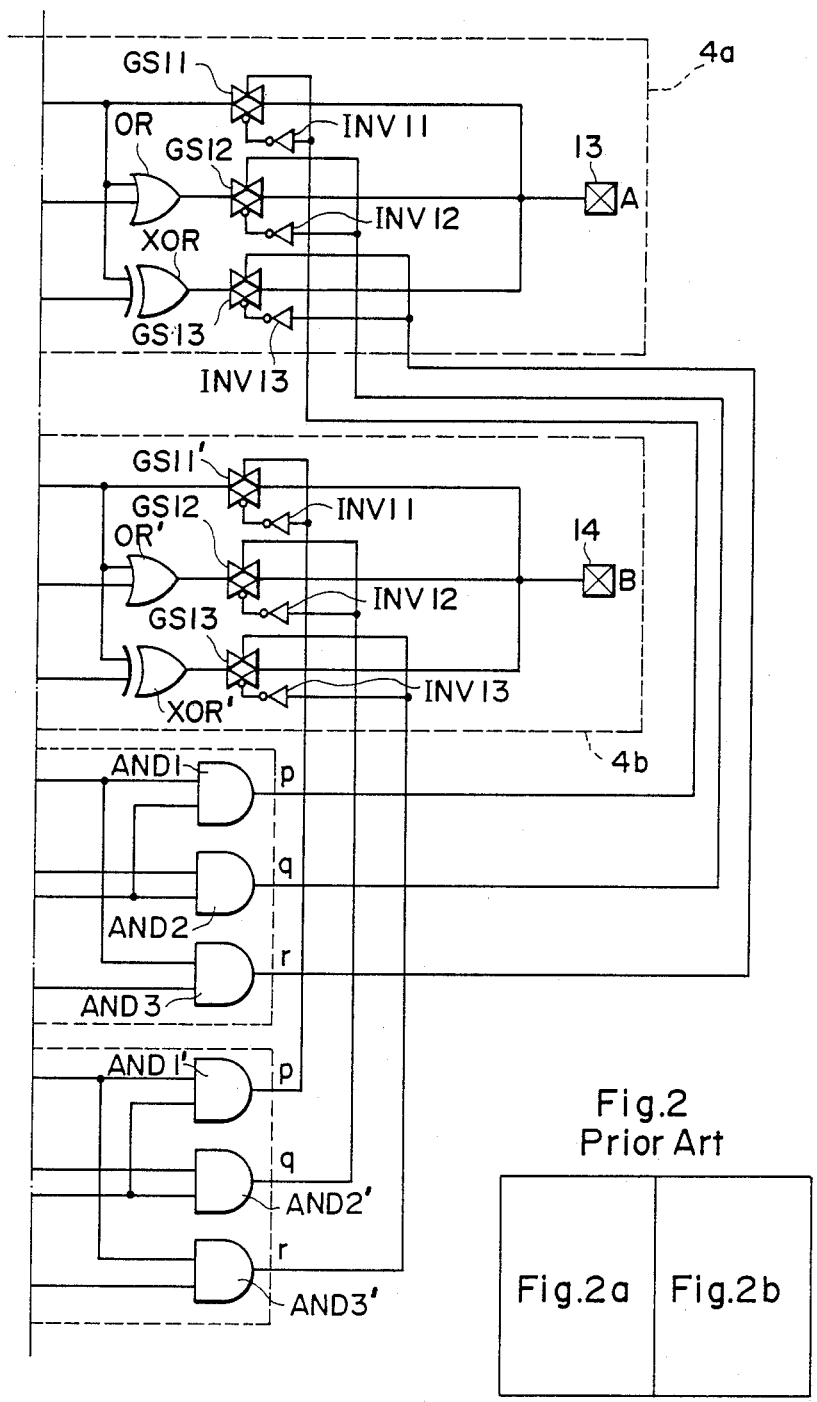

LOGIC INTEGRATED CIRCUIT DEVICE SELECTING AS OUTPUTS ANY TWO OF TWO INPUTS AND TWO LOGICAL COMBINATIONS OF THE INPUTS

BACKGROUND OF THE INVENTION

1. Field of the Invention

This invention generally relates to an integrated circuit device, and in particular to a logic integrated circuit device for outputting a desired output selectively.

2. Description of the Prior Art

FIGS. 2a and 2b, when combined as shown in FIG. 2, illustrate a prior art logic integrated circuit device comprised of a programmable logic device (PLD). The illustrated logic integrated circuit device includes a logic circuit 4a comprised of an OR gate OR, an exclusive OR gate XOR, three gate switches GS11 through GS13 and inverters INV11 through INV13. In this logic circuit 4a, an input terminal 11 to which a logic signal a is input is connected to a first input terminal of the OR gate OR, to a first input terminal of the exclusive OR gate XOR and also to an output terminal 13 through the gate switch GS11. And, an input terminal 12 to which a logic signal b is input is connected to a second input terminal of the OR gate OR and also to a second input terminal of the exclusive OR gate OR. The output terminal of the OR gate OR is connected to the output terminl 13 through the gate switch GS12 and the output terminal of the exclusive OR gate XOR is connected to the output terminal 13 through the gate switch GS13.

Logic signals p, q and r for controlling the gate switches GS11, GS12 and GS13 of the logic circuit 4a are output from output terminals of three AND gates AND1, AND2 and AND3 of a switch control circuit 5a, respectively. The output terminals of these AND gates AND1, AND2 and AND3 are connected to positive control signal input terminals of the gate switches GS11, GS12 and GS13 of the logic circuit 4a, respectively, and also to negative control signal input terminals of the gate switches GS11, GS12 and GS13 through inverters INV11, INV12 and INV13, respectively. When a H level logic signal of a predetermined positive d.c. voltage has been input into the positive control signal input terminal and at the same time a L level logic signal of ground voltage has been input into the negative control signal input terminal, the gate switches GS11, GS12 and GS13 are turned on; whereas, when a L level logic signal has been input into the positive control signal input terminal and at the same time a H level logic signal has been input into the negative control signal input terminal, the gate switches GS11, GS12 and GS13 are turned off.

There is also provided a logic circuit 4b which is constructed similarly with the above-described logic circuit 4a, and the logic circuit 4b includes a pair of input terminals 11 and 12 and an output terminal 14. In the logic circuit 4b, the input terminal 12 to which a logic signal b is input is connected to the first input terminal of each of OR gate OR and exclusive OR gate XOR and also to the output terminal 14 through the gate switch GS11, whereas the input terminal 11 to which a logic signal a is input is connected to the second input terminal of of each of OR gate OR and exclusive OR gate XOR. It is to be noted that logic signals output from the output terminals 13 and 14 of the logic circuits 4a and 4b are designated by A and B.

Also provided in the structure shown in FIGS. 2a and 2b include a pair of EPROM data read out circuits of identical structure. The data read out circuit 2a includes four MOSFETs and two floating gate type MOSFETs (FAMOSFETs). In the data read out circuit 2a, the drain of a P-channel MOSFET Q1 is connected to a d.c. power supply voltage $V_{cc}$ and this P-channel MOSFET Q1 has its gate connected to ground and its source connected to the gate and also to the drain of an N-channel MOSFET Q2. The gate of FAMOSFET Q3 is connected to a data input terminal 21a and the FAMOSFET Q3 has its source connected to ground and its drain connected to the source of MOSFET Q2 and also to the input terminal of inverter INV21 of the switch control circuit 5a. In addition, MOSFETs Q4 and Q5 and FAMOSFET Q3 are connected similarly with MOSFETs Q1 and Q2 and FAMOSFET Q3, and there is also provided a FAMOSFET Q6 which has its gate connected to a data input terminal 22a and its drain connected to the input terminal of inverter INV22 of the switch control circuit 5a. Logic signals output from the drains of FAMOSFET Q3 and Q6 of the data read out circuit 2a to the switch control circuit 5a are designated by s and t. It should also be noted that the data read out circuit 2b is constructed as connected similarly with the data read out circuit 2a.

With the data read out circuits 2a and 2b as constructed above, when a data write in voltage of a sufficiently large voltage, e.g., ±13.5 V, as compared with d.c. power supply voltage $V_{cc}$, is input into FAMOSFETs Q4 and Q6 through the input terminals 21a and 21b, these FAMOSFETs Q3 and Q6 are programmed and thus maintained off and the drain voltage of each of FAMOSFETs Q3 and Q6 becomes H level. Thus, the data read out circuits 2a and 2b output logic signals s and t of H level. On the other hand, if the write in voltage is not input into FAMOSFETs Q3 and Q6, these FAMOSFETs Q3 and Q6 are not programmed and each of FAMOSFETs Q3 and Q6 changes its state from an off state to an on state in accordance with a word line selection signal (not shown) of H level applied to the gate of each of FAMOSFETs Q3 and Q6, whereby the drain of each of FAMOSFETs Q3 and Q6 is set to L level of ground voltage. Thus, the data read out circuits 2a and 2b output logic signals s and t of L level.

The switch control circuit 5a includes four inverters INV21, INV22, INV23 and INV24 and three AND gates AND1, AND2 and AND3. In the switch control circuit 5a, the output terminal of inverter INV21 is connected to a first input terminal of each of AND gates AND1 and AND3 and also to a first input terminal of AND gate AND2 through inverter INV23. In addition, the output terminal of inverter INV22 is connected to a second input terminal of each of AND gates AND1 and AND2 and also to a second input terminal of AND gate AND3 through inverter INV24. Logic signals p, q and r output from output terminals of AND gates AND1, AND2 and AND3 are supplied to the positive control signal input terminals of gate switches GS11, GS12 and GS13, respectively, as control signals of gate switches GS11, GS12 and GS13 of the logic circuit 4a as described above. It should be noted that the switch control circuit 5b is constructed as connected similarly with the above-described switch control circuit 5a.

With the logic integrated circuit device constructed as described above, logic signals s and t output corresponding to the data set by the data read out circuits 2a and 2b are input into the corresponding switch control circuits 5a and 5b which, in response thereto, output switch control logic signals p, q and r to the respective control signal input terminals of gate switches GS11, GS12 and GS13 of the logic circuits 4a and 4b. In this case, in accordance with the signal level of each of the switch control logic signals p, q and r, the respective gate switches GS11, GS12 and GS13 are turned on or off, whereby the pair of logic circuits 4a and 4b outputs an input logic signal a or b, a logical sum signal a+b, or an exclusive logical sum signal a⊕b. Tables 1 and 2 are tables showing the relationship between each logic signal and an input/output logic signal for the switch control operation of the structure shown in FIGS. 2a and 2b.

In the above-described prior art logic integrated circuit device, three kinds of output signals may be selectively output from each of the output terminals 13 and 14 as described above depending on whether a data is written in FAMOSFETs Q3 and Q6 of the data read out circuits 2a and 2b or not. However, there is virtually no chance to use a combination of two logical sum outputs or two exclusive logical sum outputs due to the structure of the logic circuit, so that the OR gate, the exclusive OR gate and the gate switches which are not in use are redundant and they occupy an unnecessary area in the chip.

SUMMARY OF THE INVENTION

In accordance with the principle of the present invention, there is provided a logic integrated circuit device which receives a pair of first and second input logic signals and outputs one of the first input logic signal, a logical sum signal of a logical sum between the first and second logic input signals and an exclusive logical sum signal of an exclusive logical sum between the first and second logic input signals and one of the second input logic signal, the logical sum signal and the exclusive logical sum signal without requiring a large chip area in the integrated circuit device.

In accordance with one preferred embodiment of the present invention, there is provided a logic integrated circuit device, comprising: first means for receiving a pair of first and second input logic signals and outputting a logical sum signal of a logical sum between the first and second input logic signals; second means for receiving the pair of first and second input logic signals and outputting an exclusive logical sum signal of an exclusive logical sum between the first and second input logic signals; first selecting means for selecting either one of said first input logic signal and said logical sum signal as an output; and second selecting means for selecting either one of said second logic signal and said exclusive logical sum signal as an output.

With the above-described structure, the first means (logical sum means) outputs a logical sum signal of a logical sum between a pair of first and second input logical signals and the second means (exclusive logical sum means) outputs an exclusive logical sum signal of an exclusive logical sum between the pair of first and second input logical signals. The first selecting means selects either one of the first input logic signal and the logical sum signal as an output, and the second selecting means selects either one of the second input logic signal and the exclusive logical sum signal as an output. Thus, there can be output one of the first input logic signal, the logical sum signal and the exclusive logical sum signal as an output and also one of the second input logic signal, the logical sum signal and the exclusive logical sum signal as an output.

It is therefore a primary object of the present invention to obviate the disadvantages of the prior art as described above and to provide an improved logic integrated circuit device.

Another object of the present invention is to provide an improved logic integrated circuit device which receives a pair of first and second input logic signals and outputs one of the first logic signal, a logical sum signal of a logical sum betwen the first and second input logic signals and an exclusive logical sum signal of an exclusive logical sum between the first and second input logic signals as an output and one of the second logic signal, the logical sum signal and the exclusive logical sum signal as an output without wasting a chip area.

A further object of the present invention is to provide an improved logic integrated circuit device compact in size, fewer in the number of elements and easy to manufacture at low cost.

Other objects, advantages and novel features of the present invention will become apparent from the following detailed description of the invention when considered in conjunction with the accompanying drawings.

BRIEF DESCRIPTION OF THE DRAWINGS

FIG. 2 is an illustration showing how to combine FIGS. 2a and 2b; and

FIGS. 2a and 2b, when combined as shown in FIG. 2, show a prior art logic integrated circuit device.

DESCRIPTION OF THE PREFERRED EMBODIMENTS

Figure 1:
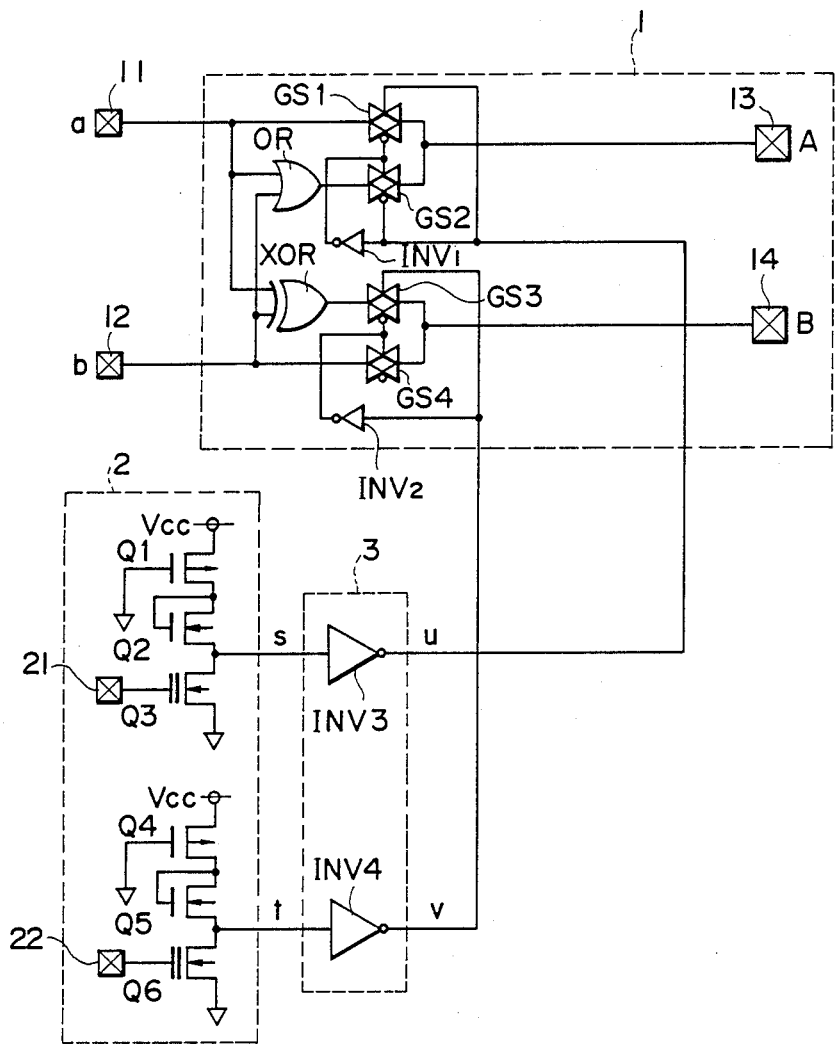
FIG. 1 is a circuit diagram illustrating a logic integrated circuit device constructed in accordance with one embodiment of the present invention.

Referring now to FIG. 1, there is shown a logic integrated circuit device comprised of a programmable logic device (PLD) and constructed in accordance with one embodiment of the present invention. It is to be noted that identical numerals with FIG. 1 indicate identical elements. The present logic integrated circuit device receives a pair of input logic signals a and b at a pair of input terminals 11 and 12 and outputs one of the first input logic signal a, a logical sum signal a+b which is a logical sum of the first and second input logic signals and an exclusive logical sum signal a⊕b which is a exclusive logical sum of the first and second input logic signals selectively and one of the second input logical signal b, a logical sum signal a+b whih is a logical sum of the first and second input logic signals and an exclusive logical sum signal a⊕b which is an exclusive logical sum signal a+b of the first and second input logic signals. And, in accordance with the present invention, there is provided a logic integrated circuit device which is significantly reduced in the number of gates and switches as compared with the prior art, thereby allowing to minimize the required chip area.

As shown in FIG. 1, the present logic integrated circuit device includes a logic circuit 1 comprising an OR gate OR, an exclusive OR gate XOR, four gate switches GS1 through GS4 and two inverters INV1 and INV2. In the logic circuit 1, the input terminal 11 to which a logic input signal a is input is connected to a first input terminal of each of the OR gate OR and the exclusive OR gate XOR and also to an output terminal 13 through the gate switch GS1. In addition, the other input terminal 12 to which a logic input signal b is input is connected to a second input terminal of each of the OR gate OR and the exclusive OR gate XOR and also to an output terminal 14 through the gate switch GS4. Furthermore, the OR gate OR has its output terminal connected to the output terminal 13 through the gate switch GS2 and the exclusive OR gate XOR has its output terminal connected to the output terminal 14 through the gate switch GS3. It is to be noted that output logic signals output from the output terminals 13 and 14 are designated by A and B, respectively. It should also be noted that the gate switches GS1 through GS4 of the logic circuit 1 operate in a similar manner as that of gate switches GS11 through GS13.

The present logic integrated circuit device also includes a data read out circuit 2, which is constructed similarly as the above-described data read out circuits 2a and 2b, and also a switch control circuit 3 which is connected between the logic circuit 1 and the data read out circuit 2. The data read out circuit 2 includes a pair of FAMOSFETs Q3 and Q4, which have their gates connected to input terminals 21 and 22 of the data read out circuit 2, respectively, and which have their drains connected to input terminals of inverters INV3 and INV4 of the switch control circuit 3, respectively. It should be noted that logic signals output from the drains of the FAMOSFETs Q3 and Q6 of the data read out circuit 2 are designated by s an t, similarly as before.

The output terminal of the inverter INV3 of the switch control circuit 3 is connected to a positive control signal input terminal of the gate switch GS1 of the logic circuit 1, to a negative control signal input terminal of the gate switch GS2 of the logic circuit 1, and also to a negative control signal input terminal of the gate switch GS1 as well as to a positive control signal input terminal of the gate switch GS2 through the inverter INV1 of the logic circuit 1. In addition, the output terminal of the inverter INV4 is connected to a positive control signal input terminal of the gate switch GS3 of the logic circuit 1, to a negative control signal input terminal of the gate switch GS4 of the logic circuit 1, and also to a negative control signal input terminal of the gate switch GS3 as well as to a positive control signal input terminal of the gate switch GS4 through the inverter INV2 of the logic circuit 1. It is to be noted that logic signals output from the output terminals of the inverters INV3 and INV4 of the switch control circuit 3 are designated by u and v, respectively.

In operation, logic signals s and t which are output corresponding to the data set at the data read out circuit 2 are input into the switch control signal 3, and in response thereto, the switch control signal 3 supplies switch control logic signals u and v to the corresponding control signal input terminals of the gate switches GS1 through GS4 of the logic signal 1. In this case, depending on the signal level of each of the switch control logic signals u and v, the gate switches GS1 through GS3 are set to be on or off, so that the logic circuit 1 outputs an input logic signal a or a logical sum signal a+b to the output terminal 13 and outputs an input logic signal b or an exclusive logical sum signal a⊕b to the output terminal 14. Tables 3 and 4 are tables showing a relationship between each logic signal and an input/output logic signal for the switch control operation of the structure shown in FIG. 1.

As can be understood from tables 3 and 4, depending on when a data is written or not written at FAMOS-FETs Q3 and Q6 of the data read out circuit 2, it can be freely selected such that an input logic signal a or a logical sum signal a+b is output at the output terminal 13 and an input logic signal b or an exclusive logical sum signal a⊕b is output at the output terminal 14.

Figure 2A:
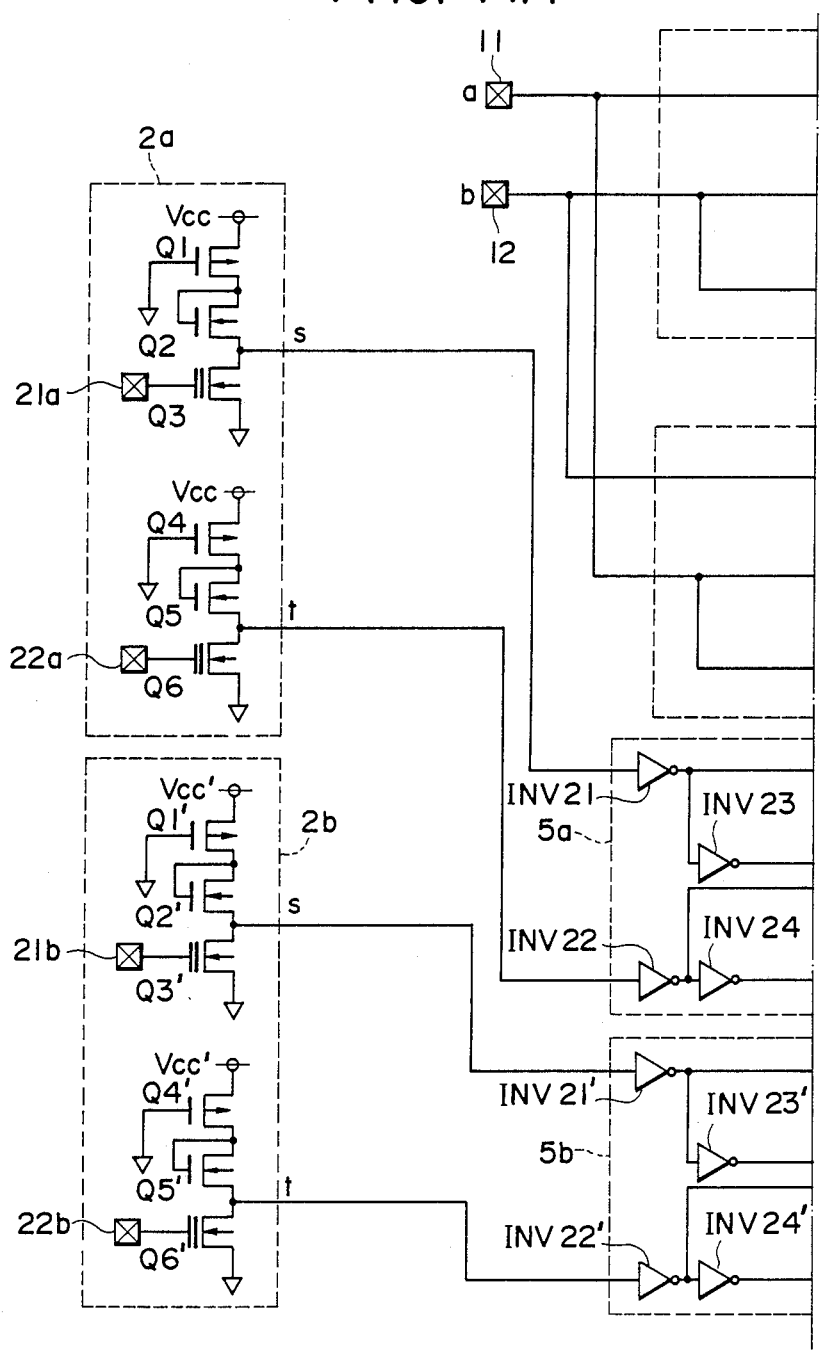

As compared with the prior art logic integrated circuit device shown in FIGS. 2a and 2b, the present logic integrated circuit device shown in FIG. 1 allows to reduce the size of the data read out circuit 2 to a half and the switch control circuit 3 is simplified in structure and includes only two inverters. In addition, the logic circuit 1 is also reduced in the number of elements, i.e., one OR gate OR, one exclusive OR gate XOR, two gate switches and four inverters. As a result, the present logic integrated circuit device of FIG. 1 is significantly reduced in the number of elements as compared with the prior art and thus the required chip area can be reduced significantly.

TABLE 1

| s | t | p | q | r | A |
|---|---|---|---|---|---|
| L | L | H | L | L | a |
| H | L | L | H | L | a + b |
| L | H | L | L | H | a ⊕ b |

TABLE 2

| s | t | p | q | r | B |
|---|---|---|---|---|---|
| L | L | H | L | L | b |
| H | L | L | H | L | a + b |
| L | H | L | L | H | a ⊕ b |

TABLE 3

| s | u | A |
|---|---|---|
| L | H | a |
| H | L | a + b |

TABLE 4

| t | v | B |
|---|---|---|
| L | H | b |
| H | L | a ⊕ b |

As described above, in accordance with the present invention, there is provided a logic integrated circuit device which is preferably comprised of a programmable logic device. The present logic integrated circuit device includes a single logical sum producing means (OR), a single exclusive logical sum producing means (XOR), first selecting means for selecting either one of a first input logic signal and a logical sum signal output from the logical sum producing means, and second selecting means for selecting either one of a second input logic signal and an exclusive logical sum signal output from the exclusive logical sum producing means. Thus, in accordance with the present logic integrated circuit device, there can be output one of the first input logic signal, the logical sum signal and the exclusive logical sum signal and one of the second input logic signal, the logical sum signal and the exclusive logical sum signal. The present logic integrated circuit device is significantly reduced in the number of elements and thus requires a significantly reduced chip area as compared with the prir art.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A logic integrated circuit device comprising:
   a first input terminal for receiving a first input logic signal and a second input terminal for receiving a second input logic signal
   first means receiving said first and second input logic signals and producing a logical sum signal of said first and second input logic signals, and having a first output supplying said logical sum signal;
   second means receiving said first and second input logic signals and producing an exclusive logical sum signal of said first and second input logic signals, and having a second output supplying said exclusive logical sum signal;
   first selecting means coupled to said first input terminal and said first output for selecting one of said first input logic signal and said logical sum signal as a first output of said device; and
   second selecting means coupled to said second input terminal and to said second output for selecting one of said second input logic signal and said exclusive logical sum signal as a second output of said device;
   wherein said first selecting means includes a first MOS transistor having a first gate connected to a third input terminal and having first source/drain terminals connected between a first pair of predetermined voltages, with a first load connected between one of said first predetermined voltages and one of said first source/drain terminals, and a first inverter having an input connected to the junction between the first load and the first MOS transistor and having an output coupled to said first input terminal and said first output.

2. The device of claim 1 wherein said first means includes an OR circuit having a first input terminal connected to said first input terminal for receiving said first input logic signal, a second input terminal connected to said second input terminal for receiving said second input logic signal and an output terminal connected to a first output terminal of said device through a first gate switch.

3. The device of claim 1 wherein said second means includes an exclusive OR circuit having a first input terminal connected to said first input terminal for receiving said first input logic signal, a second input terminal connected to said second input terminal for receiving said second input logic signal and an output terminal connected to a second output terminal of said device through a second gate switch.

4. The device of claim 2 wherein said first input terminal for receiving said first input logic signal is connected to said first output terminal of said device through a third gate switch.

5. The device of claim 3 wherein said second input terminal for receiving said second input logic signal is connected to said second output terminal of said device through a fourth gate switch.

6. The device of claim 1 wherein said second selecting means includes a second MOS transistor having a second gate connected to a fourth input terminal and having second source/drain terminals connected between a second pair of predetermined voltages, with a second load connected between one of said second predetermined voltages and one of said second source/drain terminals, and a second inverter having an input connected to the junction between the second load and the second MOS transistor and an output coupled to said first input terminal and said first output.

* * * * *